: US 12,217,463 B2
: Feb. 4, 2025

(12) United States Patent
Hainline

(54) ADAPTABLE AND HIERARCHICAL POINT CLOUD COMPRESSION

(71) Applicant: Raytheon Company, Arlington, VA (US)

(72) Inventor: Allen R. Hainline, Waltham, MA (US)

(73) Assignee: Raytheon Company, Arlington, VA (US)

( * ) Notice: Subject to any disclaimer, the term of this patent is extended or adjusted under 35 U.S.C. 154(b) by 305 days.

(21) Appl. No.: 17/854,842

(22) Filed: Jun. 30, 2022

(65) Prior Publication Data

US 2024/0005559 A1 Jan. 4, 2024

(51) Int. Cl.
*G06T 9/00* (2006.01)
*G06T 3/40* (2024.01)
*G06T 5/70* (2024.01)

(52) U.S. Cl.
CPC ............ *G06T 9/00* (2013.01); *G06T 3/40* (2013.01); *G06T 5/70* (2024.01); *G06T 2207/10028* (2013.01); *G06T 2207/20021* (2013.01)

(58) Field of Classification Search
CPC .... G06T 9/00; G06T 3/40; G06T 5/70; G06T 2207/10028; G06T 2207/20021; G06T 9/001; H03M 7/3086; H03M 7/6029; H03M 7/70; H03M 7/3077; H04N 19/124; H04N 19/597
See application file for complete search history.

(56) References Cited

U.S. PATENT DOCUMENTS

| | | | |
|---|---|---|---|
| 2020/0314435 A1* | 10/2020 | Tourapis | G06T 7/74 |
| 2021/0217203 A1 | 7/2021 | Kim et al. | |
| 2022/0383552 A1* | 12/2022 | Hur | G06T 9/004 |

OTHER PUBLICATIONS

International Search Report and Written Opinion in Application No. PCT/US2023/024787 dated Sep. 12, 2023, 13 pages.
"V-PCC codec description," 131 MPEG Meeting; Jun. 29, 2020-Jul. 3, 2020; Online (Motion Picture Expert Group or ISO/IEC JTC1/SC29/WG11) No. n19526 (Oct. 7, 2020), Retrieved from the Internet: URL:https://dms.mpeg.expert/doc_end_user/documents/131_OnLine/wg11/w19526.zip w19526_VPCC_TMv11_AlgorithmDescription.doc [retrieved on Oct. 7, 2020], 73 pages.

(Continued)

*Primary Examiner* — Edward F Urban
*Assistant Examiner* — Wassim Mahrouka
(74) *Attorney, Agent, or Firm* — Schwegman Lundberg & Woessner, P.A.

(57) ABSTRACT

Systems and methods are provided for point cloud compression. An exemplary method includes: receiving point cloud data; quantizing the point cloud data to remove noise to produce quantized point cloud data; generating, using the quantized point cloud data, a plurality of multi-level tiles; performing reordering within the multi-level tiles to optimize a compression rate producing a plurality of reordered multi-level tiles; bit packing the reordered multi-level tiles minimizing bits required to store per tile header data producing a bit packed multi-level tile data; and performing additional compression on the bit-packed multi-level tile data using a first compression algorithm.

20 Claims, 6 Drawing Sheets

(56) References Cited

OTHER PUBLICATIONS

Lilley, S., "Compressing Massive Point Clouds with 3D Tiles and Draco," Cesium, Feb. 26, 2019 (Feb. 26, 2019), pp. 1-6, XP093078557, Retrieved from the Internet: URL:https://cesium.com/blog/2019/02/26/draco-point-clouds/ [retrieved on Sep. 4, 2023], 8 pages.

Various: "3D Tiles Specification 1.0," Open Geospatial Consortium, Jan. 31, 2019 (Jan. 31, 2019), pp. 1-80, XP093078559, Retrieved from the Internet: URL:https://docs.ogc.org/cs/18-053r2/18-053r2.html [retrieved on Sep. 4, 2023], 119 pages.

Golla Tim et al: "Real-time point cloud compression," 2015 IEEE/RSJ International Conference on Intelligent Robots and Systems (IROS), IEEE, Sep. 28, 2015 (Sep. 28, 2015), pp. 5087-5092, XP032832361, DOI: 10.1109/IROS.2015.7354093 Retrieved from the Internet: URL:https://ieeexplore.ieee.org/stamp/ stamp.jsp?tp=&arnumber=7354093&tag=|> [retrieved on Dec. 11, 2015], 6 pages.

\* cited by examiner

| LOCATION | BPF MB | PCD MB | RATIO |
|---|---|---|---|
| MOSUL | 5827.3 | 701.2 | 8.3 |
| CITYLINE | 84.8 | 12.9 | 6.6 |
| JACKSONVILLE | 96.1 | 10.4 | 9.3 |
| BUENOS AIRES | 146.8 | 15.6 | 9.4 |

*FIG. 4*

ADAPTABLE AND HIERARCHICAL POINT CLOUD COMPRESSION

BACKGROUND

A point cloud is essentially a huge collection of individual points plotted in three-dimensional (3D) space. It's made up of a multitude of points captured using an imaging system. If you're scanning a building, for example, each virtual point would represent a location on the wall, window, stairway, metalwork, or any surface. High-resolution point clouds require significant storage; thus, significant compression is needed for applications including On-Board Navigation and Targeting.

There is a need to provide a framework that efficiently compresses point clouds.

SUMMARY

According to one aspect of the subject matter described in this disclosure, a system for point cloud compression is provided. The system includes one or more computing device processors. One or more computing device memories are coupled to the one or more computing device processors. The one or more computing device memories store instructions executed by the one or more computing device processors, wherein the instructions are configured to: receive point cloud data; quantize the point cloud data to remove noise producing quantized point cloud data; generate, using the quantized point cloud data, a plurality of multi-level tiles; perform reordering within the multi-level tiles to optimize a compression rate producing a plurality of reordered multi-level tiles; bit pack the reordered multi-level tiles minimizing bits required to store per tile header data producing a bit packed multi-level tile data; and perform additional compression on the bit-packed multi-level tile data using a first compression algorithm.

According to another aspect of the subject matter described in this disclosure, a method for point cloud compression is provided. The method includes the following: receiving point cloud data; quantizing the point cloud data to remove noise producing quantized point cloud data; generating, using the quantized point cloud data, a plurality of multi-level tiles; performing reordering within the multi-level tiles to optimize a compression rate producing a plurality of reordered multi-level tiles; bit packing the reordered multi-level tiles minimizing bits required to store per tile header data producing a bit packed multi-level tile data; and performing additional compression on the bit-packed multi-level tile data using a first compression algorithm.

According to another aspect of the subject matter described in this disclosure, a non-transitory computer-readable storage medium storing instructions which when executed by a computer cause the computer to perform a method for point cloud compression is provided. The method includes the following: receiving point cloud data; quantizing the point cloud data to remove noise producing quantized point cloud data; generating, using the quantized point cloud data, a plurality of multi-level tiles; performing reordering of the multi-level tiles to optimize a compression rate producing a plurality within reordered multi-level tiles; bit packing the reordered multi-level tiles minimizing bits required to store per tile header data producing a bit packed multi-level tile data; and performing additional compression on the bit-packed multi-level tile data using a first compression algorithm;

Additional features and advantages of the present disclosure is described in, and will be apparent from, the detailed description of this disclosure.

BRIEF DESCRIPTION OF THE DRAWINGS

The disclosure is illustrated by way of example, and not by way of limitation, in the figures of the accompanying drawings in which like reference numerals are used to refer to similar elements. It is emphasized that various features may not be drawn to scale and the dimensions of various features may be arbitrarily increased or reduced for clarity of discussion.

FIG. 4 is a schematic diagram of compression results of the point cloud compression algorithm (PCCA) of method 100 of FIG. 1, in accordance with some embodiments.

DETAILED DESCRIPTION

Figure 1:
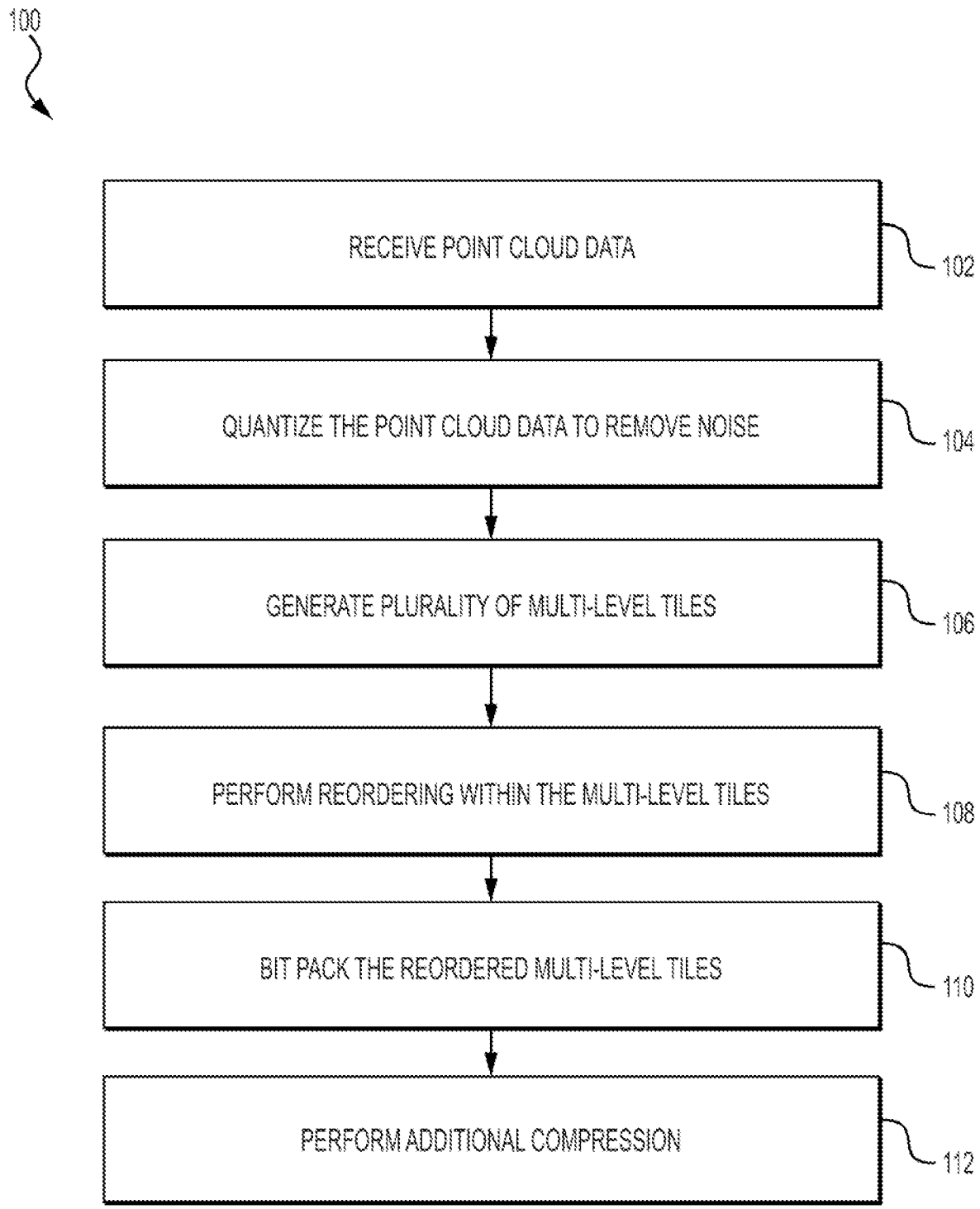
FIG. 1 is a flowgraph of operations included in an example process 100 for compressing a point cloud, in accordance with some embodiments.

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may recognize that other elements and/or operations may be desirable and/or necessary to implement the devices, systems, and methods described herein. But because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

The terminology used herein is for the purpose of describing particular example embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another element, component, region, layer or section. That is, terms such as "first," "second," and other numerical terms, when used herein, do not imply a sequence or order unless clearly indicated by the context.

This disclosure describes a framework for elevation data compression. The framework includes a format for storing three-dimensional (3D) point clouds since the Binary Point File (BPF) format was not designed for compression. The storage requirements for formats such as BPF fall way short of the goals for many uses—for example a mission geared toward supporting Tactical Users. Also, BPF is not well-suited for certain types of processing due to its lack of spatial subsets or tiles. Thus, for example, finding 3D data near a particular geographic location requires loading the entire point cloud and extensive searching.

Other 3D formats have inferior compression rates and/or are inadequate because they lack support for error propagation (such as the GPM support within BPF.) The framework is directed to providing an improved format for storing relevant 3D data in a minimal number of bytes.

Moreover, the framework serves as a sort of native 3D format used during Passive 3D (P3D) point cloud generation and in many contexts, such as Bare Earth processing, terrain classification, enhanced change detection, pan-sharpening, ortho-rectification, and the like. As a tiled format, the format utilized by the framework may allow for extensibility to new per-point data and scalability to arbitrarily large point clouds compared to using BPF. In addition, the framework includes support for efficient parallelism.

FIG. 1 is a flowgraph of operations included in an example method 100 for point cloud compression, in accordance with some embodiments. The operations may be implemented using computer-executable instructions stored on one or more non-transitory machine-readable storage media. The instructions may be executed by one or more processing devices, such as the processor 500, as described in FIG. 5, to implement the operations.

Method 100 includes receiving point cloud data (Step 102). Method 100 includes quantizing the point cloud data, x, y, z coordinate values, to remove noise producing quantized point cloud data (Step 104). The coordinate x, y, and z values are quantized to minimize noise. Just as image intensity values are generally stored as integers so that noise beyond radiometric precision is omitted, also one should minimize extra digits beyond geometric precision. The framework may allow the desired precision to be specified as input or could be determined dynamically when accuracy information is included. Because the framework currently supports data in either geodetic or Universal Transverse Mercator (UTM) coordinates (or other map projections), the quantization can be performed in a scaled, fixed-point binary format. The map coordinates are first scaled based on desired precision settings and then appropriately rounded. In other embodiments, different coordinate systems may be used to support the framework besides geodetic or UTM coordinates. In some embodiments, latitude and longitude information can be converted to fixed point binary format even though these start off as high-precision floating point numbers.

Thus, the low-level compression code can treat all data effectively as integral. The emphasis is on developing the best lossless compression that preserves these fixed-point binary values. Note that multiple compression approaches are already implemented, and some may persist long-term as options to choose from. So long as the decompressor knows which compression scheme is employed, the compressor can choose from among whatever approach yields the best compression rate. That decision can be made on a tile-by-tile or super-tile basis and is captured in metadata for proper decompression.

Figure 6:
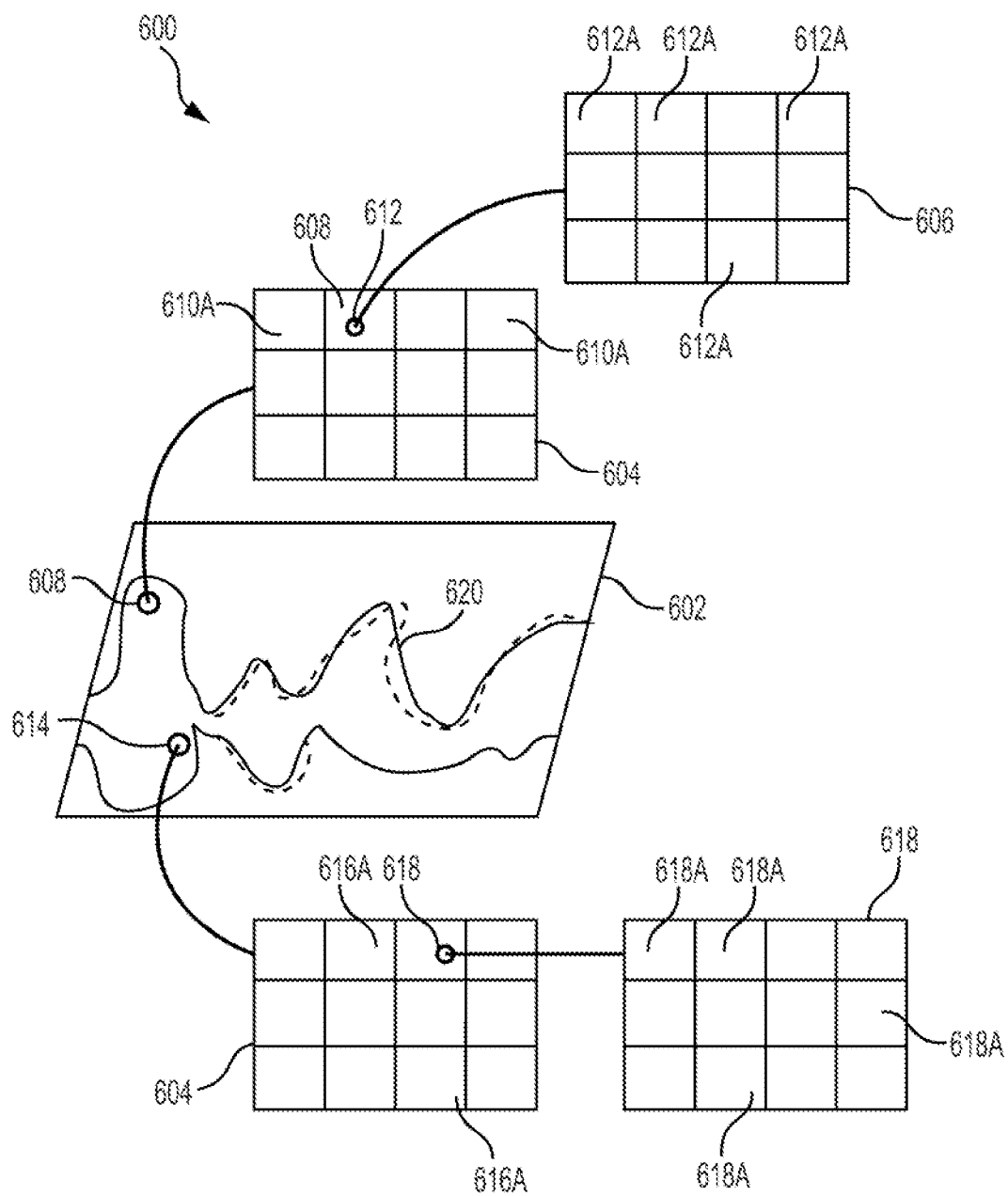
FIG. 6 is a schematic diagram of a multi-level tile, in accordance with some embodiments.

Method 100 includes generating, using the quantized point cloud data, a plurality of multi-level tiles (Step 106). The multi-level tiles are used to organize storage within tiles so that high-order bits are the same within the tile. For example, if a UTM point cloud has post locations quantized in tenths of a meter, then sorting 3D points into tiles that span 6.4 m by 6.4 m requires only that x and y each vary between 0 and 63 to convey the location within that tile. Thus, already just 12 bits could store the x and y values. Also, multi-level tiling helps provide quick access to a given search region within a point cloud. Note that the smaller the tile size, the easier it is to provide random access and the better the compression because fewer high-order bits need to be supplied to place x and y values in the larger context. However, there is some overhead in storing offsets to tiles and the necessary info to decompress each tile. This limits how small a tile size can be before it starts requiring more bits. FIG. 6 shows a detailed depiction of the multi-level tiles described herein.

The intensity compression schemes offered may be the same as that used for z values or a different approach could be employed. Unfortunately, the x and y compression approach doesn't work as well in the z-dimension. Although one could do compression for 3D tiled voxels, the local z variance may require many voxels to cover a given x,y region. Different approaches may be used to best compress z values and can be automatically selected during processing based on which may achieve the best compression ratio. One approach is to store z values relative to a minimum for a given tile or delta z values relative to the previous value. In many cases, there is also at least one band of intensity value to store per post and other data, such as indexes to per point-error covariance data. Multiple bands of intensity values may be compressed independently or, if as is common, bands are fairly correlated, better compression rates may be achieved by compressing them together. For simplicity, the following documents dealing with a single band of intensity data—even though some embodiments include many more bands, including even support for hyperspectral sensors. For example, RGB (red-green-blue) intensities could be converted to a luminance-chrominance space where chrominance values may be locally constant and the luminance band captures varying brightness. Exploiting locally constant chrominance values in the compression scheme saves bits.

Method 100 includes performing reordering within the multi-level tiles to optimize a compression rate producing a plurality of reordered multi-level tiles (Step 108). The reordering here is really of the 3D points within a tile, for example to keep them as spatially close as possible to minimize x or y delta distances from a previous point. The reordering approach may include combining x and y values into a single word. The reordering approach also may store deltas between successive entries after sorting. Then only the delta values need to be persisted and not the entire, combined xy value. In other implementations, the reordering approach includes reordering x and y bits within a word so that the lowest order overall xy bit is the lowest order x bit.

The next higher bit in xy is then taken from the lowest order bit from the y value. The interleaving of x and y bits means that posts with small deltas in x and y also have small deltas in this interleaved xy space. Thus, xy delta values (DeltaXY) in the interleaved space tend to have minimal values when posts cluster in subsets of tiles. This approach proved to compress better than a naïve combining of x and y values.

In addition, this interleaved space provides a better way to compress z or intensity values since these also tend to be more similar in spatially nearby regions. However, in a majority of scenes tested, the height values are equally well compressed as just deltas relative to the lowest height in the tile. Note also that a given tile could choose to interleave to minimize the number of bits for that tile, so long as the decompressor knows the algorithm for mapping back to x and y values. The sorting is transparent to the decompressor in most embodiments as it does not rely on any particular ordering within a tile, although one could exploit that later in search algorithms. One option is that each tile computes the maximum of the xy delta values (maxDeltaXY) and the maximum of the h delta values (maxH) that need to be stored, and this is conveyed in the tile overhead bits for each higher level tile of tiles so that each tile uses a custom approach to packing and unpacking xy and h delta values. These are combined into a single word as the xy deltas, and the h deltas don't have to be stored in separate bits.

In some embodiments, the xy data and the z (height data) values are packed together by multiplying by one more than the maximum z delta value. This is slightly more efficient than using separate bits for xy and z fields. The max possible xyz value computes the number of bits for a particular tile. Thus, these max delta values need to be stored per tile to perform decompression properly. The deltas from 2 posts to be packed together before rounding storage to the nearest bit achieved even more efficient compression. On average, this saves 1 bit per pair of posts, although there is no bit saved for the last post in the tile when the posts per tile are an odd number. Potentially this could be applied to groups of even more than two posts, although it is a situation of diminishing returns. If the words to be inserted or extracted become too large, it complicates and slows down the bit-twiddling operations.

As previously mentioned, small tiles tend to result in higher compression rates until tile overhead bits become excessive. Considerable effort has been expended to compress these overhead bits by packing them together to minimize even fill bits, much less fill bytes. The number of bytes per tile is stored for each tile based on the number of bits needed to express the max bytes for any one tile. For example, if the max bytes in any one tile is 921, then tile lengths would be expressed in 10-bit words packed together with no gaps between tile sizes. These can be extracted and used to compute offsets for each tile to perform decompression on any subset of tiles. Thus, a use case involving only a spatial subset of a point cloud file is quite efficient using this framework as only the necessary tiles would need to be read in and decompressed.

Method 100 includes bit packing the reordered multi-level tiles, which minimizes bits required to store per tile header data producing a bit packed multi-level tile data (Step 110). This involves grouping tiles stored together in a hierarchical approach. The minimum height in a given tile doesn't have to be fully specified in absolute terms but can be expressed relative to the super-tile minimum values. For example, consider the scenario where a point cloud of a mountain scene is being compressed. Each tile might have minimums heights such as 1034.7, 1269.9, and 876.1 meters and would require 13-16 or so bits each. However, if the tiles are stored together in a super-tile, the minimums can be expressed relative to the minimum height in the super-tile, which might be 800 meters. Then the heights per tile to be stored relative to that are smaller numbers (234.7, 469.9, 76.1) and thus require fewer bits to store. Also, loading a two-dimensional (2D) super-tile is more efficient than if there wasn't this additional hierarchical level.

Compression and decompression are quite fast and are multi-threaded. Compression is more computationally intensive than decompression, but unless the optional, additional first compression algorithm is included, is not too much slower. Minimizing the amount of I/O contributes to the efficiency, and each tile can be independently compressed or decompressed in different threads. However, multiple per tile routines are invoked to fully build up a compressed file that captures the offset info. A common bottleneck for efficient parallelization relates to memory contention, and so these compressed inputs or outputs minimize this effect by limiting the memory bandwidth required in processing.

One may use generic bit insertion and extraction routines to simplify the packing and unpacking of bits. These are performed in 64-bit words for greater efficiency. This minimizes the number of times that bit twiddling operations span words and exploits most modern processors' maximum native word size. These functions use what effectively amounts to a bit index to know which bit position in which 64-bit word to extract from or insert into.

In some implementations, an object-oriented language, such as C++, may be used to develop the instructions defining a first class that performs functionality that applies to the entire point cloud. One may use another type to perform functionality associated with one tile's worth of data. In embodiments, the framework may support Big Endian or Little Endian machines.

The bit index is updated so that the client can merely iterate over words to be compressed or decompressed using routines to create or extract the bit sequences but must still do their packing or unpacking of deltas from those. A Big Endian approach may be used internally in memory for bit packing since tiles start on byte boundaries that are not necessarily 64-bit word boundaries. Thus, some byte swapping is conditionally performed but only when running on Little Endian machines. These are very efficient operations and parallelized.

In some implementations, compression of per-point indexes to the covariance data needed for 3D error propagation has been performed using local deltas and bit packing. Generally, about 3 bits per 3D point is required to store this data.

Method 100 includes performing additional compression on the bit-packed multi-level tile data using a first compression algorithm (Step 112). Additional improvements to compression ratio on the order of 20-30% were demonstrated by using Lempel-Ziv-Markov chain algorithm (LZMA) to compress the bit-packed data at the super-tile level. This compression scheme was well-suited to this data, and other compression schemes may also be used.

For some applications, it is critical to know the accuracy of each point in the point cloud. This may be based on a rigorous error propagation of errors in sensor metadata. The sensor metadata may include attitude and ephemeris data that affect the absolute and relative pointing inaccuracy that manifest in an ellipsoidal region of uncertainty as to the exact position of each 3D point. These vary throughout a point cloud based on the number of image rays intersected in forming each point and the accuracy of the images used in the correlation process. The accuracy information can be stored as indexes into a smaller number of error covariance matrices, usually less than 100 unique values. For that example case, each 3D point needs a 7-bit index associated with it to identify which matrix conveys the accuracy information. These indexes can be further compressed using run-length encoding and/or the strategy of deltas relative to previous values in a stream or to the minimum value in a tile.

In some implementations, the size of tile overhead bits is based on the number of bits for the maxDeltaXY and the maxH across all tiles. Also, the minimum of the height (H) deltas (minH) per tile is stored, and that is can be expressed relative to the minimum across all tiles. One could minimize all of these by storing data relative to some grouping of tiles. For example, if minH was stored relative to a 10×10 group of tiles rather than relative to all tiles, values to be persisted would be smaller and thus require fewer bits. The extra bits to store the data per 10×10 tile would be minimal on a per tile basis due to the factor of 100 reduction. Just as there is some savings from packing together xy and h deltas before compressing as an N bit word, some of these values in the tile overhead data could first be combined before inserting them into a bit stream.

Figure 2:
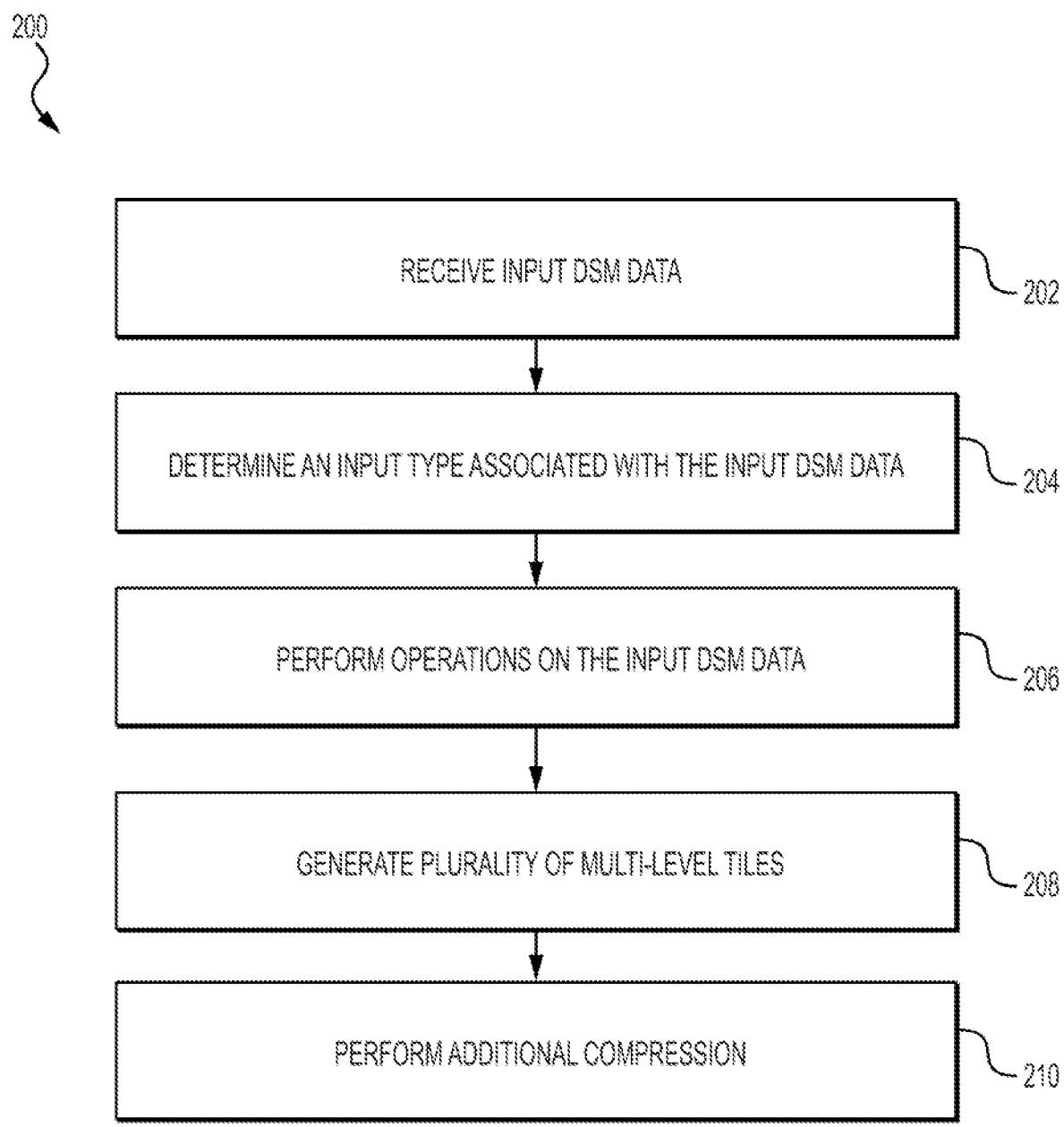
FIG. 2 is a flowgraph of operations included in an example process 200 for compressing a gridded digital surface model (DSM) image and associated attributes, in accordance with some embodiments.

FIG. 2 is a flowgraph of operations included in an example process 200 for compression of a gridded digital surface model (DSM) image, in accordance with some embodiments. The operations may be implemented using computer-executable instructions stored on one or more non-transitory machine-readable storage media. The instructions may be executed by one or more processing devices, such as the processor 500, as described in FIG. 5, to implement the operations.

Method 200 includes receiving input DSM data (Step 202). The input DSM data may include point cloud (unconstrained elevation data or the like) or an already gridded elevation dataset, either of which may have other data attributes associated with each point. Also, the input DSM data may include intensities or accuracy data. Method 200 includes determining an input type associated with the input DSM data (Step 204). In this case, the input type may be an unconstrained or a gridded elevation dataset. Upon determining the input type, performing, based on the input type, operations on the input DSM data to produce gridded DSM data (Step 206). In response to the input type being an unconstrained dataset, the input DSM data is interpolated to a regularly spaced grid. In response to the input type being a gridded elevation data set, the gridded elevation data set is quantized to remove noise producing quantized DSM image information. The gridded coordinates x, y, and z values are quantized so that one is limiting the amount of noise being compressed since noise tends to be random and does not compress well. Image intensity values are generally stored as integers, so noise beyond radiometric precision is often already omitted. The 3D compression framework/standard allows the desired accuracy to be specified as input, which could later be determined dynamically.

Method 200 includes generating, using the gridded information, a plurality of multi-level tiles (Step 208). The multi-level tiles are similar to the multi-level tiles described in method 100, where the multi-level tiles are used to organize storage within tiles so that high-order bits are the same within the tile. Moreover, the multi-level tiles provide quick access to a given search region within a gridded DSM image. Note that the smaller the tile size, the easier it is to provide random access and the better the compression. However, there is some overhead in storing offsets to tiles and the information needed to decompress each tile. This limits how small of a tile size can be chosen before it starts requiring more bits.

Method 200 includes performing additional compression on the reordered multi-level tiles using a first compression algorithm (Step 210). In this case, the first compression algorithm may be a 2-D discrete wavelet transform compression approach, such as JPEG2000 lossless compression or the like. Gridded DMS images include elevation data being stored at regularly spaced coordinates in either geodetic space or a map projection. Each type of elevation data also optionally includes other per-point fields, such as intensity data for one or more bands and error covariance information. This eliminates the need for bit packing. Generally, the best compression rates may be achieved by compressing each type of data attribute fields independently.

Thus, height data would be losslessly-compressed via a wavelet-based approach and the resulting bit-stream would be appended to the losslessly-compressed intensity data. This type of per-attribute grouping per tile will almost always result in better compression rates than just compressing data interleaved by attribute (although nothing in this method precludes the latter if in rare cases that was superior). The per-tile metadata needs to capture the interleaving/grouping approach. If the same approach is used per super-tile or for all super-tiles then interleaving information can be conveyed only at the higher level so that per tile overhead bits can be minimized.

Note that method 100 and 200 are not limited to compressing intensities, per point indexes and 3D data but can be applied to any attributes one wants to associate with 3D data points.

If the Exploitation-Preferred JPEG200 encoding (EJPE) is used, the bit stream also has the inherent property of supplying lower-resolution versions of height data using the first bits in the stream. Subsequent sets of bits provide increasingly higher spatial resolution. This is helpful for use cases such as navigation where data might be accessed through relatively low bandwidth streaming because data is made available at incrementally higher resolutions, at a step size of 2× per dimension each time.

In some embodiments, other compression format besides JPEG2000 may be used for compressing the reordered multi-level tiles.

An example point cloud containing 2.43 million posts was stored using an average of 1.77 bytes per post (including all header and tile overhead bits) and took 0.012 seconds to compress and write out using method 100. Only 0.0023 seconds were required to read in decompress the data. Other datasets produced similar or better results.

In another example of point cloud compression, an original BPF file 1178 MB was compressed via LASZip to 45.4 MB (without error covariance data). Still, compression using method 100 was able to store this in only 38.8 MB (including per point error covariance data).

Excellent compression ratios were obtained using method 200, including JPEG2000 lossless compression to compress actual gridded height data. Note that it is inherently much easier to compress height data in this regularly spaced gridded format because the x and y values effectively do not have to be stored as the location implies them within the grid. For example, for a couple of different commercial cases tested, the bits per post was 5.49 for a Jacksonville case and 5.64 for a case built from some SPOT imagery.

In some embodiments, method 100 and method 200 are performed by a computer system simultaneously, such as computer system 500. In this case, the computer system determines whether point cloud compression or DSM image compression is required. This determination may be based on the desired output, in this case, the desired output being in an unconstrained or gridded format.

Figure 3:
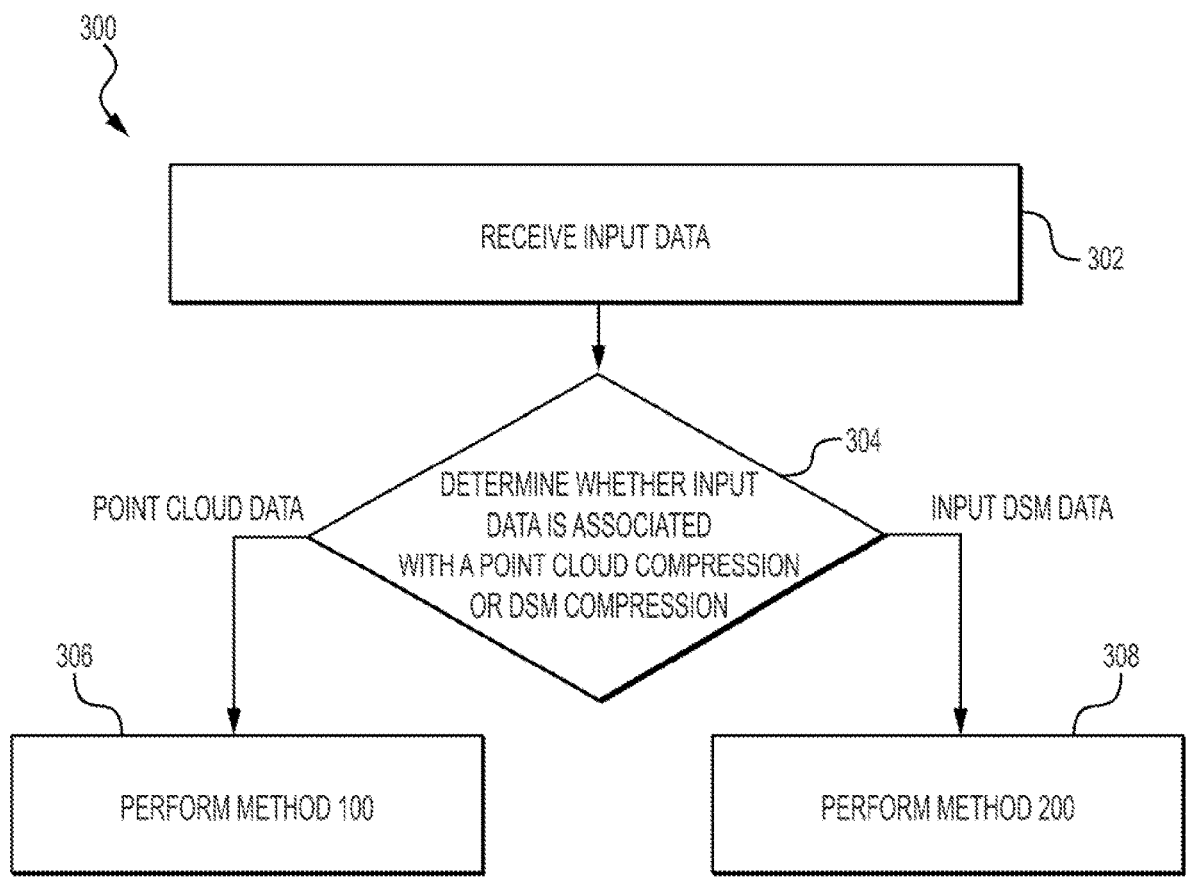
FIG. 3 is a flowgraph of operations included in an example process 300 for compressing elevation data, in accordance with some embodiments.

FIG. 3 is a flowgraph of operations included in an example method 300 for compression of an image, in accordance with some embodiments. The operations may be implemented using computer-executable instructions stored on one or more non-transitory machine-readable storage media. The instructions may be executed by one or more processing devices, such as the processor 500, as described in FIG. 5, to implement the operations.

Method 300 includes receiving input data (Step 302). The input data may be point cloud data having unconstrained elevation data or DSM data having both unconstrained elevation data or gridded format data. Also, the input data may include intensities or accuracy data. A determination is made as to whether the input data is associated with point cloud compression or DSM image compression (Step 304). This determination may be based on whether the intended output associated with method 300 is to be an unconstrained (point cloud) or a gridded (DMS) output. Upon determining the input data is associated with point cloud data image compression, method 100 includes performing a point cloud compression comprising steps 102-112 of method 100 using the input data as point cloud data (Step 306). Upon determining the input data is associated with DSM image compression, method 200 includes performing a DSM image compression comprising steps 202-210 of method 200 using the input data as input DSM data (Step 308).

In some implementations, a seamless interface is provided for compression while concealing implementation details such as whether the image is a gridded DSM image or point cloud.

FIG. 4 is a schematic diagram of compression results of the point cloud compression algorithm (PCCA) of method 100 of FIG. 1, in accordance with some embodiments. In particular, FIG. 4 shows the compression results of four scenes (Mosul, Cityline, Jacksonville. and Buenos Aires). Moreover. FIG. 4 shows the size of the uncompressed point cloud (binary point file (BPF) in megabytes (MB), the compressed point cloud using the PCCA of method 100 in MB, and the corresponding compression ratios. Each of the compression ratios were over 6 indicating the point clouds were compressed by a factor of 6 or more. These are significantly improved results compared to other prior compression techniques.

Figure 5:
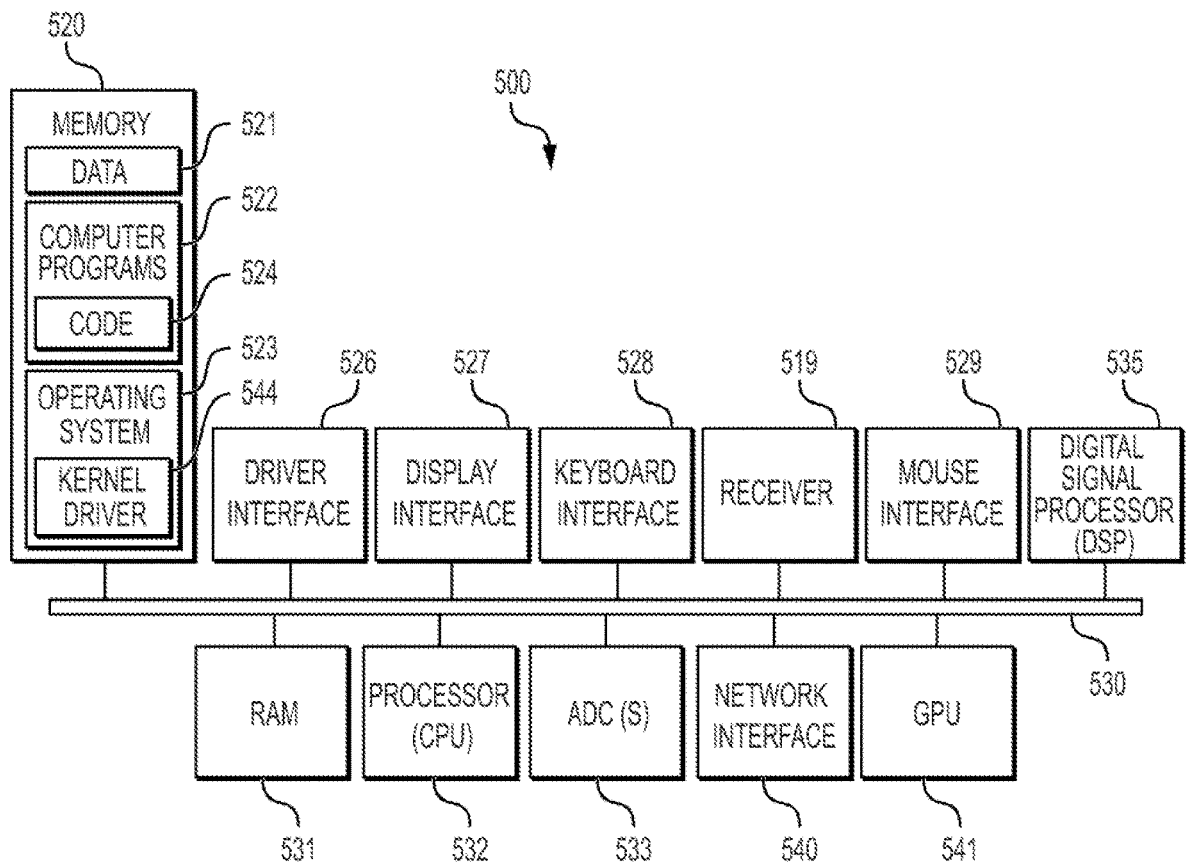
FIG. 5 is a schematic diagram of components that may be included in a computing system, in accordance with some embodiments.

FIG. 5 is a schematic diagram of components that may be included in a computing system 500, in accordance with some embodiments. As shown in FIG. 5, computing system 500 includes memory 520, which may include a non-transitory computer-readable medium such as a computer hard disk. Memory 520 stores data 521, computer programs 522, and operating system 523, among other things. The operating system 523 includes a driver, for example a kernel driver 544, for controlling the operations of computer system 500. Among the computer programs stored in memory 520 is computer code 524 associated with methods 100, 200, and/or 300. Also included in computing system 500 are drive interface 526, display interface 527, keyboard interface 528, mouse interface 529, one or more computer buses 530, random access memory (RAM) 531, processor (CPU) 532, and graphic processing unit (GPU) 541. The computer system 500 may include a display that works in conjunction with display interface 527, and a keyboard that works in conjunction with keyboard interface 528 for inputting text and user commands. Also, the computer system 500 may include a mouse that works in conjunction with mouse interface 529 for positioning a cursor on display screen and for inputting user commands.

In some embodiments, memory 520 may contain multiple memory components for storing data. In some embodiments, RAM 531 may contain multiple RAMs for processing computer instructions.

Processor 532 may be a microprocessor, programmable logic, or the like for executing computer programs, such those noted above, out of RAM 531. Processor 532 accesses computer programs (or other data) stored on an external device via drive interface 526. GPU 541 is a type of processing device. For example, the GPU 541 may be a programmable logic chip that is configured to implement and to control display functionality. To this end, a GPU 541 may be programmed to render images, animation, and video on the computer's screen. The GPU 541 may be located on a plug-in card or in a chipset on the motherboard of the computing system, or the GPU 541 may be in the same physical chip as the CPU 532. In some implementations, the CPU 532 may contain multiple CPUs. The multiple CPUs may be configured for parallel computing, in some embodiments.

The computer system 500 may have a receiver 519, e.g., a radio receiver, to receive and/or transmit information wirelessly or the like. Computing system 500 may also include one or more analog to digital converters (ADC) 533 to convert incoming analog RF signals from receiver 519 to digital samples. The computing system 500 may also include a digital signal processor (DSP) 535 to perform digital signal processing operations on the digital samples. The DSP 535 may also be operated to improve the quality of the digital samples. The DSP may also be capable of executing computer programs that do not relate to signal processing.

Computing system 500 includes a network interface 540, such as an Ethernet port, for interfacing to a network, such as the Internet. In some embodiments, computing system 500 may be a server connected to multiple computing systems 500.

In some implementations, multiple electronic components, such as the GPU 541, the CPU 532, and/or the DSP 535, may execute one or more computer programs concurrently or contemporaneously. In some implementations, the GPU 541 may contain multiple components of each type shown in FIG. 5; for example, multiple CPUs, multiple OPUs, multiple DSPs, and so forth. One or more of each type of component may be configured to execute one or more computer programs concurrently, contemporaneously, or simultaneously.

FIG. 6 is a schematic diagram of a multi-level tile 600, in accordance with some embodiments. Note multi-level tile 600 is the same as the multi-level tile of method 100. The multi-level tile 600 is first derived from a point cloud 602 by grouping points into 2D-tiles and higher-level tiles of tiles. All tiles that fall within a higher-level tile of tiles would generally be stored contiguously for rapid access to regional subsets without having to read in a lot of extra data. Points 608 and 614 are positioned within an object 620 imaged in point cloud 602. Point 608 in point cloud 602 may be defined by tiles 610A. A point 612 in tile 610A may be further defined by additional tiles 612A. In another region on object 620, point 614 is defined by tiles 616A. A point 618 in tile 616A may be further defined by additional tiles 618A. Tiles 608A. 612A, 616A, and 618A may be 2D segments defined by their respective points 608, 612, 616A, and 618. The arrangements of tiles 608A, 612A, 616A, and 618A formed a super-tile defining the hierarchy of multi-level tile 600.

In some implementations, additional levels of tiles in the hierarchy of multi-level 600 may be used, which may be helpful in very large point clouds. Some advantages of the hierarchical organization include minimizing the number of bits to store location information or storing intensity values as delta values relative to the tile. The tile start value is stored as a delta relative to the super-tile minimum intensity value, as described in method 100. Also, the hierarchy of multi-level tile 600 facilitates retrieving a smaller area of contiguous bytes to obtain data in a 2D subset of point cloud 602 since all the data in a super-tile is stored contiguously, and all the data in a tile is stored contiguously.

The disclosure describes a framework for elevation data compression. The advantages provided by the framework include lossless algorithms for efficient compression and decompression of elevation data and various per-point attributes such as intensities and error covariance indexes. The framework utilizes very fine-granularity tiles to minimize x and y values (since stored as relative offsets) that improve efficiency in accessing subsets of data. The framework uses clever reordering of 3D points among multiple possible strategies to choose one with the most optimal compression ratio. The framework may use bit-packing of header info to avoid fill bits. The framework allows differing strategies to compress different types of data. For example, LZMA compression may be used in conjunction with the DPCM-type approach for 3D points in a point cloud, or JPEG2000 may be used to compress gridded DSM information.

Reference in the specification to "one implementation" or "an implementation" means that a particular feature, structure, or characteristic described in connection with the implementation is included in at least one implementation of the disclosure. The appearances of the phrase "in one implementation," "in some implementations," "in one instance," "in some instances," "in one case," "in some cases," "in one embodiment," or "in some embodiments" in various places in the specification are not necessarily all referring to the same implementation or embodiment.

Finally, the above descriptions of the implementations of the present disclosure have been presented for the purposes of illustration and description. It is not intended to be exhaustive or to limit the present disclosure to the precise form disclosed. Many modifications and variations are possible in light of the above teaching. It is intended that the scope of the present disclosure be limited not by this detailed description, but rather by the claims of this application. As will be understood by those familiar with the art, the present disclosure may be embodied in other specific forms without departing from the spirit or essential characteristics thereof. Accordingly, the present disclosure is intended to be illustrative, but not limiting, of the scope of the present disclosure, which is set forth in the following claims.

What is claimed is:

1. A system for compressing a point cloud, the system comprising:
   one or more computing device processors; and
   one or more computing device memories, coupled to the one or more computing device processors, the one or more computing device memories storing instructions executed by the one or more computing device processors, wherein the instructions are configured to:
   receive point cloud data;
   quantize the point cloud data to remove noise producing quantized point cloud data;
   generate, using the quantized point cloud data, a plurality of multi-level tiles;
   perform reordering of the multi-level tiles to optimize a compression rate producing a plurality of reordered multi-level tiles;
   bit pack the reordered multi-level tiles minimizing bits required to store per tile header data producing a bit packed multi-level tile data; and
   perform additional compression on the bit-packed multi-level tile data using a first compression algorithm.

2. The system of claim 1, wherein while quantizing the point cloud data, the instructions are configured to quantize the point cloud data in a scaled, fixed-point binary format.

3. The system of claim 1, wherein multi-level tiles comprise a plurality of tile configured to organize storage within tiles so that high-order bits are the same within a tile.

4. The system of claim 1, wherein while performing reordering within the multi-level tiles, the instructions are configured to store attribute value relative to a minimum of a tile.

5. The system of claim 1, wherein while performing reordering within the multi-level tiles, the instructions are configured to store attribute values relative to a neighboring value in a reordered set of points.

6. The system of claim 1, wherein while performing reordering within the multi-level tiles, the instructions are configured to compute a maximum of a plurality of elevation values.

7. The system of claim 1, wherein while performing reordering within the multi-level tiles, the instructions are configured to store attributes using run-length encoding.

8. The system of claim 1, wherein while bit packing the reordered multi-level tiles, the instructions are configured to group a select number of the multi-level tiles to form a super-tile.

9. The system of claim 1, wherein the first compression algorithm is a Lempel-Ziv-Markov chain algorithm (LZMA).

10. A method for compressing a point cloud, the method comprising:
    receiving point cloud data;
    quantizing the point cloud data to remove noise producing quantized point cloud data;
    generating, using the quantized point cloud data, a plurality of multi-level tiles;
    performing reordering within the multi-level tiles to optimize a compression rate producing a plurality of reordered multi-level tiles;
    bit packing the reordered multi-level tiles minimizing bits required to store per tile header data producing a bit packed multi-level tile data; and
    performing additional compression on the bit-packed multi-level tile data using a first compression algorithm.

11. The method of claim 10, wherein quantizing the point cloud data comprises quantizing the point cloud data in a scaled, fixed-point binary format.

12. The method of claim 10, wherein multi-level tiles comprise a plurality of tile configured to organize storage within tiles so that high-order bits are the same within a multi-level tile.

13. The method of claim 10, wherein performing reordering within the multi-level tiles comprises storing attribute value relative to the minimum of a tile.

14. The method of claim 10, wherein performing reordering within the multi-level tiles comprises storing attribute values relative to a neighboring value in a reordered set of points.

15. The method of claim 10, wherein performing reordering within the multi-level tiles comprises computing a maximum of a plurality of elevation values.

16. The method of claim 10, wherein performing reordering within the multi-level tiles comprises storing attributes using a run-length encoding.

17. The method of claim 10, wherein bit packing the reordered multi-level tiles comprises grouping a select number of the multi-level tiles to form a super-tile.

18. The method of claim 17, wherein bit packing the reordered multi-level tiles comprises determining a minimum elevation within the super-tile.

19. The method of claim 10, wherein the first compression algorithm is a Lempel-Ziv-Markov chain algorithm (LZMA).

20. A non-transitory computer-readable storage medium storing instructions which when executed by a computer cause the computer to perform a method for compressing a point cloud, the method comprising:
- receiving point cloud data;
- quantizing the point cloud data to remove noise producing quantized point cloud data;
- generating, using the quantized point cloud data, a plurality of multi-level tiles;
- performing reordering within the multi-level tiles to optimize a compression rate producing a plurality of reordered multi-level tiles;
- bit packing the reordered multi-level tiles minimizing bits required to store per tile header data producing a bit packed multi-level tile data; and
- performing additional compression on the bit-packed multi-level tile data using a first compression algorithm.

* * * * *